United States Patent [19]

McClure et al.

[11] Patent Number: 5,450,019

[45] Date of Patent: Sep. 12, 1995

[54] PRECHARGING OUTPUT DRIVER CIRCUIT

[75] Inventors: David C. McClure; Mark A. Lysinger, both of Carrollton; William C. Slemmer, Dallas, all of Tex.

[73] Assignee: SGS-Thomson Microelectronics, Inc., Carrollton, Tex.

[21] Appl. No.: 185,650

[22] Filed: Jan. 26, 1994

Related U.S. Application Data

[63] Continuation of Ser. No. 809,387, Dec. 17, 1991, abandoned.

[51] Int. Cl.$^6$ ............................................. H03K 17/16
[52] U.S. Cl. ........................................ 326/28; 326/27; 326/121; 326/95
[58] Field of Search ....................... 307/451-452, 307/481, 943, 475, 296.5, 296.8; 365/203

[56] References Cited

U.S. PATENT DOCUMENTS

| | | | |
|---|---|---|---|
| 4,604,731 | 8/1986 | Konishi | 307/452 |
| 4,751,407 | 6/1988 | Powell | 307/481 |
| 4,876,465 | 10/1989 | Podkowa et al. | 307/443 |
| 4,880,997 | 11/1989 | Steele | 307/451 |
| 4,893,276 | 1/1990 | Okuyama | 365/189.08 |
| 4,962,343 | 10/1990 | Nakagawa et al. | 307/481 |
| 4,983,860 | 1/1991 | Yim et al. | 307/481 |
| 4,992,677 | 2/1991 | Ishibashi et al. | 307/443 |
| 5,051,619 | 9/1991 | Campione | 307/443 |
| 5,124,577 | 6/1992 | Davis et al. | 307/359 |
| 5,151,621 | 9/1992 | Goto | 307/475 |

FOREIGN PATENT DOCUMENTS 0471289 8/1991 European Pat. Off. .

OTHER PUBLICATIONS

Okuyuma, et al., "A 7.5 ns 32K X 8 CMOS SRAM", IEEE J. Solid State Circ., vol. 23, No. 5 (IEEE, 1988) pp. 1054–1059.

Primary Examiner—Edward P. Westin
Assistant Examiner—Andrew Sanders
Attorney, Agent, or Firm—Rodney M. Anderson; Lisa K. Jorgenson; Richard K. Robinson

[57] ABSTRACT

A push-pull output driver circuit is disclosed which includes control circuitry for controlling the gates of the driver transistors to effect precharge of the output terminal at the beginning of a cycle. Precharge is initiated at the beginning of each cycle, for example indicated by an address transition. The prior data state at the output is stored, and enables the opposing driver transistor from that which drove the stored prior data state by enabling a gated level detector with hysteresis, such as a Schmitt trigger, associated therewith. The transistor that drove the stored prior data state is disabled, thus precluding oscillations during precharge. The gated Schmitt triggers each receive the voltage of the output terminal and, when enabled, turn on a transistor which couples the output terminal to the gate of the driver transistor. The Schmitt triggers also control the precharge to terminate when the output terminal has reached an intermediate voltage, and so that oscillations are minimized as a result of the hysteresis characteristic. Connection of the output terminal to the gate of the precharging driver transistor helps to eliminate overshoot during precharge.

23 Claims, 5 Drawing Sheets

PRECHARGING OUTPUT DRIVER CIRCUIT

The present application is a continuation of application Ser. No. 07/809,387, filed Dec. 17, 1991, now abandoned.

This invention is in the field of integrated circuits, and is more specifically directed to output drivers in integrated circuits.

BACKGROUND OF THE INVENTION

Computer system performance, and thus the size and complexity of the data processing applications that a computer system is capable of adequately operating, depends strongly upon the operating performance of its integrated circuits components, especially the central processing unit (e.g., the microprocessor) and the memory sub-systems. Significant effort continues to be made toward improving the speed of integrated circuit components, such speed measured as cycle times and access times. As these times reduce, especially for such devices as extremely fast access time static random access memories (SRAMs), the time required to drive data output terminals from one state to another is becoming a more significant portion of the overall cycle or access time of the circuit.

As is well known in the art, the output terminals of integrated circuits implemented in a system generally are connected to other integrated circuits by way of conductive circuit board lines. A common arrangement is for several integrated circuits to be interconnected by way of a bus. The load presented by such conductors, including its resistance and capacitance and that of the other integrated circuits connected thereto, can be quite significant. For example, most memory circuit access times are specified for a capacitive load of on the order of 30 to 100 pf. It is therefore common practice to fabricate the driver transistors in output buffers to be as large as possible.

The extremely fast switching provided by large driver transistors generate significant transient noise, however, coupling to power supply and ground lines. Furthermore, since modern computer systems communicate up to thirty-two bits of digital information in parallel, many integrated circuits simultaneously present data at from eight to thirty-two output terminals. The level of transient noise generated by multiple output circuits is, of course, greatly increased in the case where multiple output terminals simultaneously switch from the same state to the opposite state over a brief (less than 10 nsec) interval. Indeed, if all but one of the output terminals switch in the same direction, sufficient noise may couple to the remaining non-switching output terminal to cause a false state thereat.

Figure 1:
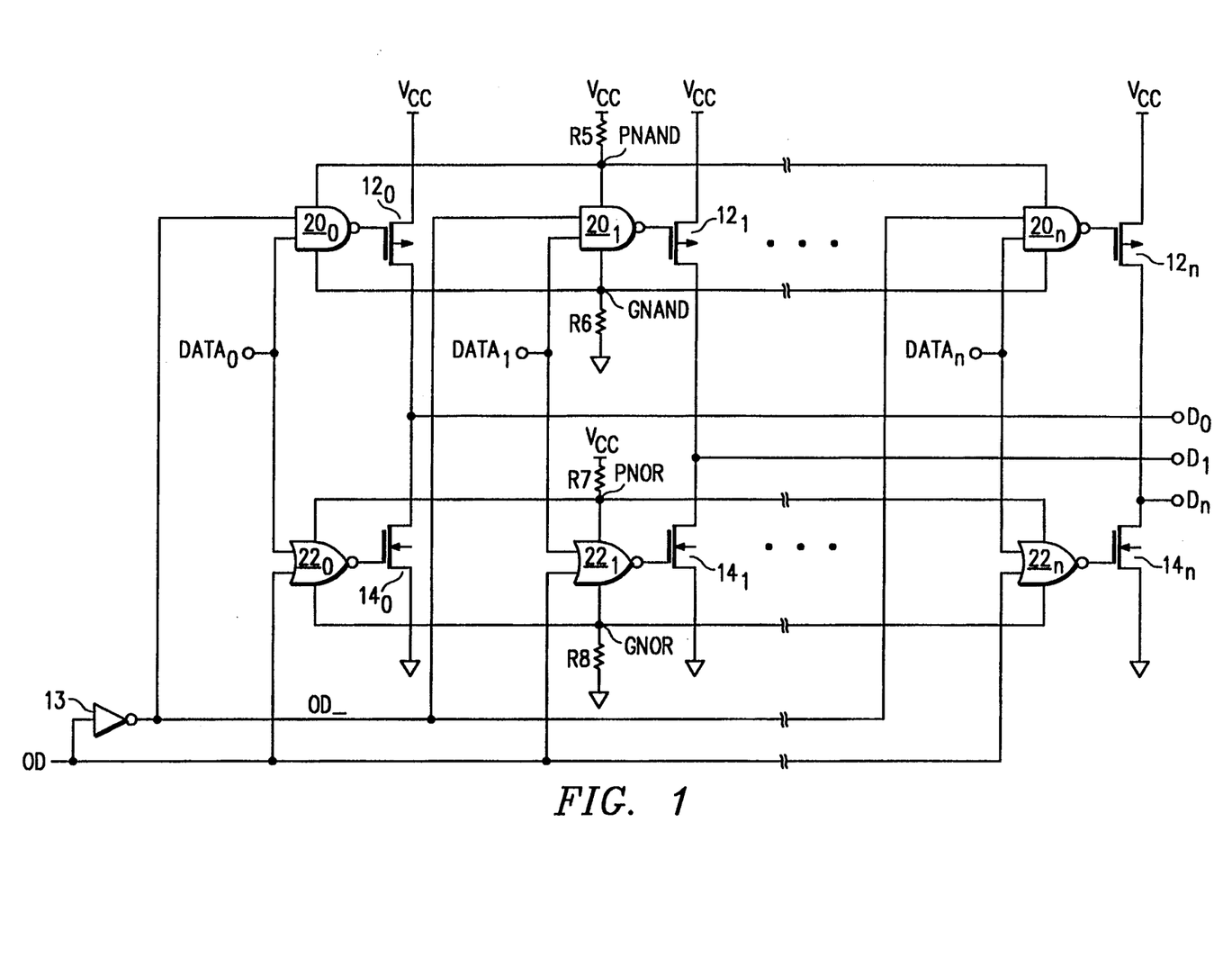
FIG. 1 is an electrical diagram, in schematic form, of a prior output driver circuit.

Referring now to FIG. 1, an example of an output driver circuit which is particularly suitable for multiple output modern SRAM integrated circuits will now be described. The output driver circuit of FIG. 1 is described in copending application Ser. No. 601,288, filed Oct. 22, 1990, assigned to SGS-Thomson Microelectronics, Inc., and incorporated herein by reference. In the arrangement of FIG. 1, each data terminal $D_0$ through $D_n$ is driven by a CMOS push-pull output driver of p-channel pull-up transistor 12 and n-channel pull-down transistor 14. The gate of each pull-up transistor is driven by NAND function 20, and the gate of each pull-down transistor is driven by NOR function 22. Each NAND function 20 and NOR function 22, for each data terminal D, receives a data signal on an associated data line DATA, and also receives a common disable signal on line OD (and its complement $OD_{13}$ for NAND functions 20). As described in said copending application 601,288, common resistors R5 through R8 are provided through which the NAND functions 20 and NOR functions 22 for the multiple data terminals D are biased to $V_{cc}$ and ground (i.e., the power supply and ground nodes of NAND and NOR functions 20, 22, respectively, for all data terminals D are connected at common nodes PNAND, GNAND, PNOR, GNOR). This construction provides for control of the switching speed of the outputs, and thus the noise, in a particularly efficient and effective manner.

In operation, a high logic level on line OD (and thus a low logic level on line $OD_{13}$) will cause each of NAND functions 20 and NOR functions 22 to turn off their associated driver transistor 12, 14, respectively, thus placing their associated data terminal D in a high impedance state. Conversely, a low logic level on line OD (and corresponding high logic level on line $OD_{13}$) allows the state of the associated data line DATA to determine the output state. The circuit of FIG. 1 has been fabricated into actual integrated circuits, and has demonstrated the capability of fully switching the output state of a data terminal D from "rail-to-rail", when fully loaded and in worst case conditions, in 6.5 nsec. The transient noise for the circuit of FIG. 1, considering eight data terminals D switching in the same direction simultaneously, has been observed at the ground terminal to be as high as 1.25 volts. While such performance is quite good for SRAM devices in many applications, these switching speed and noise levels may not be compatible for extremely high speed (sub-20 nsec access time) SRAM devices, particularly with byte-wide or word-wide organization.

By way of background, it is known in the memory circuit art to precharge memory bit lines, by which selected memory cells are connected to sense amplifiers and write circuitry, to a known voltage between memory cycles. Such precharging improves the time necessary for the next selected memory cell to present its data state on the bit lines. An example of a circuit and method for precharging bit lines in an SRAM integrated circuit is described in copending application Ser. No. 627,050, filed Dec. 13, 1990, incorporated herein by this reference. The voltage to which bit lines in memory arrays are precharged may be the power supply voltage, ground, or a mid-level voltage therebetween.

By way of further background, a scheme for precharging an output terminal of a memory integrated circuit is described in Okuyuma, et al., "A 7.5 ns 32K×8 CMOS SRAM" *IEEE J. Solid State Circ.*, Vol. 23, No. 5 (IEEE, 1988) pp. 1054–1059. As described therein relative to FIG. 6 of the article, a new cycle is indicated by detection of an address transition and the driving of both the true and complement data lines to a low level. In this prior technique, the low level on both true and complement data lines enables the voltage at terminal OUTPUT to turn on the opposite driver transistor, so that terminal OUTPUT is charged or discharged, as the case may be, to an intermediate level prior to the next data state being presented thereat.

The Okuyuma et al. scheme is subject to several limitations, however, Firstly, the intermediate level is reached by way of a "crowbar" condition (i.e., a DC path between $V_{cc}$ and ground) during precharge through the circuitry which biases the driver transistors during precharge. In the case where transistor Q1 is turned on during precharge, crowbar current is drawn through the inverter and pull-down transistor biasing the gate of transistor Q1; conversely, crowbar current is drawn through the inverter and pull-up transistor biasing the gate of transistor Q2 when it is precharging the output. In either case, DC current is drawn during precharge. Furthermore, no provision for disabling the precharge condition is present in the disclosed circuit, allowing bus contention to occur in the event of another integrated circuit driving the bus to which terminal OUTPUT is connected. Furthermore, the output driver disclosed in the Okuyuma, et al. article is subject to oscillations due to the feedback connection of terminal OUTPUT to the opposite driver transistor, as there is no apparent provision for turning off the gate driving transistors responsive to the intermediate level being reached at OUTPUT, and also because each of the driver transistors Q1, Q2 can be enabled during a precharge operation. In addition, the circuit disclosed in the Okuyuma et al. article may also be vulnerable to overshoot conditions, depending on the characteristics of the output load.

It is therefore an object of this invention to provide an output driver circuit with improved switching performance.

It is a further object of this invention to provide such an output driver circuit with both high speed switching and also reduced transient noise generation.

It is a further object of this invention to provide such an output driver circuit which avoids crowbar condition and oscillation, such that it is suitable for use with high speed memories in a low-power applications, such as portable computers powered by batteries.

Other objects and advantages of the present invention will become apparent to those of ordinary skill in the art having reference to the following specification together with the drawings.

SUMMARY OF THE INVENTION

The present invention may be incorporated into an output driver circuit in an integrated circuit such as a memory or microprocessor, by way of control circuits that turn on the main driver transistor opposite the previous data state at the output terminal. In the case of a push-pull output driver, the control circuits are controlled responsive to a precharge signal and to the prior data state so that only the driver transistor opposing the prior data state is enabled during precharge, preventing crowbar current and oscillation which can result from both driver transistors being turned on during precharge. The prior data state is latched so that the selection of which of the driver transistors to enable during precharge is not subject to the precharged state of the terminal. A gated Schmitt trigger is used to monitor the state of the output terminal, so that precharge is terminated at the desired voltage, and to eliminate oscillation due to noise coupling. In addition, the gates of the driver transistors are biased during precharge by the voltage at the output terminal itself, so that the precharging driver transistor is turned off in the event of rapid overshoot of the precharge voltage.

DETAILED DESCRIPTION OF THE PREFERRED EMBODIMENT

Figure 2:
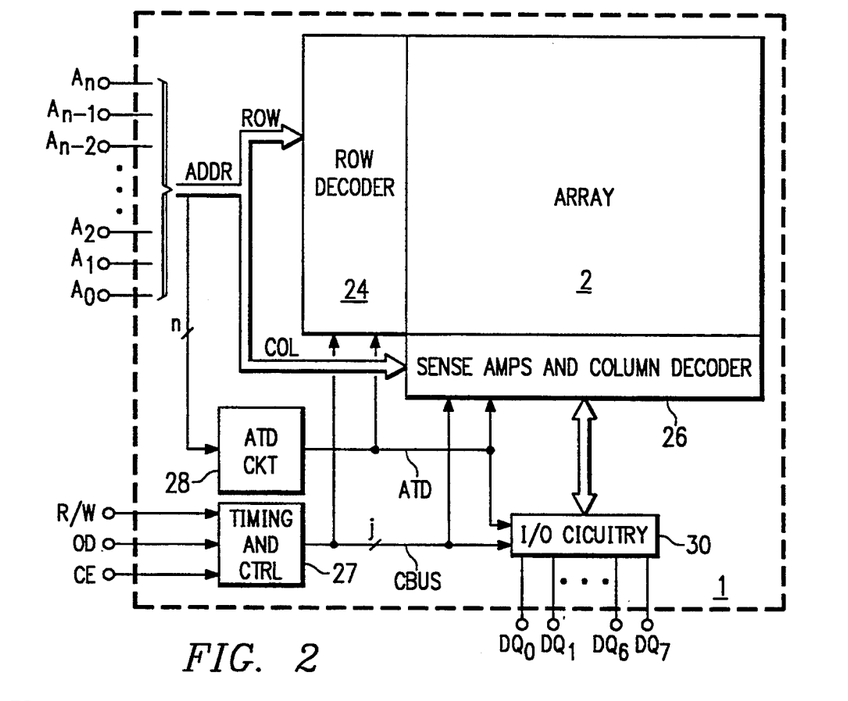
FIG. 2 is an electrical diagram, in block form, of an example of a memory integrated circuit into which the preferred embodiment of the invention may be incorporated.

Referring now to FIG. 2, an example of an integrated circuit into which the present invention may be incorporated will now be described. While FIG. 2 illustrates memory 1, in particular a static random access memory (SRAM), it is of course contemplated that any type of integrated circuit having outputs at which digital signals are to be presented, particularly those having multiple outputs which simultaneously present data at high switching speeds, can benefit from the present invention. Such integrated circuits include memory circuits, logic circuits such as microprocessors, logic arrays, and the like, as well as other digital data processing or communication circuits.

Memory 1 includes array 2 of memory cells arranged in rows and columns. Memory 1 includes address terminals $A_0$ through $A_n$ at which a digital address is received corresponding to the memory locations to be selected each cycle; conventional address buffers (not shown) receive the address signal presented at address terminals A, and communicate the received on address bus ADDR. Row address bus ROW communicates certain address bits on address bus ADDR to row decoder 24, and column address bus COL communicates the remaining address bits from address bus to sense amplifiers and column decoder 26. As such, one or more memory cells are selected in the conventional manner, by way of row decoder 24 enabling a selected row according to the row address signal on bus ROW, and by way of sense amplifiers 26 selecting one or more of the memory cells according to the value on column bus COL.

In this example, memory 1 is a read/write memory and has eight common input/output terminals $DQ_0$ through $DQ_7$. Input/output circuitry 30 is connected to terminals $DQ_0$ through $DQ_7$, for receiving input data therefrom in a write operation, and for presenting data thereto in a read operation. Selection of a read or write operation is indicated at terminal R/W which is received by timing and control circuitry 27. Other conventional types of control signals received by timing and control circuitry 27 include a chip enable signal at terminal CE, and an output disable signal at terminal OD. Timing and control circuitry 27 generates various internal control signals based on the signals it receives, and communicates these generated signals on control bus CBUS to input/output circuitry 30, sense amplifiers and column decoder 26, row decoder 24, and other circuits in memory 1, for controlling the same in the conventional manner.

Copending application Ser. No. 588,601, filed Sept. 26, 1990, assigned to SGS-Thomson Microelectronics, Inc., and incorporated herein by this reference, describes an example of a modern SRAM device in more detail than that given hereinabove. It is contemplated that the above description, however, will provide sufficient contextual information to enable one of ordinary skill in the art to readily practice the present invention in any type of integrated circuit which can benefit therefrom.

As is well known, the internal circuitry of most integrated circuits includes several sequential, or synchronous, internal operations; as such, a timing signal such as a clock is used in many types of circuits to control the operations. For example, the timing signal for controlling the internal operation of SRAM memory 1 of FIG. 2, including the operation of the output driver according to the embodiment of the present invention described hereinbelow, is generated by address transition detection (ATD) circuit 28. ATD circuit 28 is a well known type of circuit for monitoring the state of address lines $A_0$ through $A_n$, or alternatively the lines of address bus ADDR after buffering, and for generating a pulse on line ATD responsive to detection of a transition on one or more of the monitored lines. Other input terminals, such as chip enable, read/write, and data input terminals, may similarly be monitored by ATD circuit 28, and the signal on line ATD generated responsive to transitions thereat. A preferred example of ATD circuit 28, which operates in combination with the address buffers (not shown) connected to terminals $A_0$ through $A_n$, is described in copending application Ser. No. 601,287, filed Oct. 22, 1990, assigned to SGS-Thomson Microelectronics, Inc. and incorporated herein by this reference. The pulse on line ATD is communicated to row decoder 24 and sense amplifiers and column decoder 26, for control thereof in the conventional manner. Line ATD is also connected to input-/output circuitry 30 for control of read and write operations in the conventional manner, and for control of the presentation of output data at terminals $DQ_0$ through $DQ_7$ in the manner described hereinbelow.

In the alternative to a timing signal generated by ATD circuit 28, an externally generated clock signal may be applied to memory 1, for controlling it in a synchronous manner. In this case, as is well known, such an external clock signal would control the initiation and duration of a memory cycle.

Figure 3:
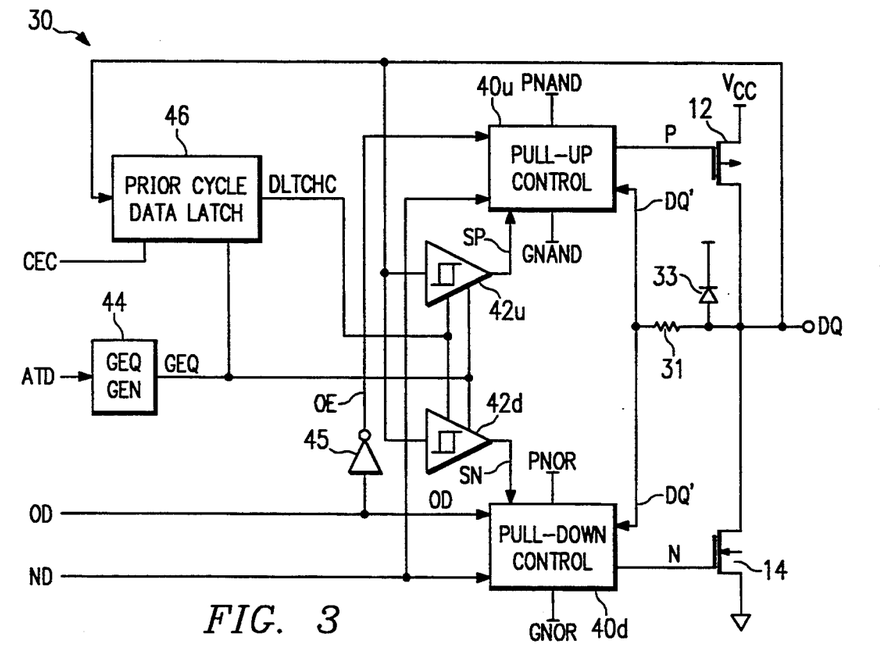
FIG. 3 is an electrical diagram, in combination block and schematic form, of the output driver circuit according to the preferred embodiment of the invention.

Referring now to FIG. 3, an output driver contained within input/output circuitry 30 for driving one of terminals DQ, and constructed according to the preferred embodiment of the invention, will now be described in detail. Similar drivers are, of course, implemented for each terminal DQ in memory 1. As terminals DQ in memory 1 of FIG. 2 are common input/output terminals, receiving data during write cycles and presenting data during read cycles, conventional input circuitry will be connected in parallel with the output driver circuitry of FIG. 3 in the conventional manner. For ease of description, the input and accompanying write circuitry is not shown in FIG. 3. Furthermore, it is contemplated that the present invention is also applicable in, and equivalently beneficial to, integrated circuits having dedicated output terminals.

According to this embodiment of the invention, as in the case illustrated in FIG. 1, terminal DQ is driven by a CMOS push-pull driver. As such, terminal DQ is connected to the drains of p-channel pull-up transistor 12 and n-channel pull-down transistor 14; the sources of transistors 12 and 14 are connected to $V_{cc}$ and $V_{ss}$ (i.e., ground), respectively. The gate of pull-up transistor is driven by pull-up control circuit 40u via line P, and the gate of pull-down transistor 14 is driven by pull-down control circuit 40d via line N.

While a CMOS push-pull driver is described herein, the full benefit of the invention may of course be obtained in other push-pull driver configurations such as where both transistors are n-channel or p-channel. Furthermore, while the implementation of the present invention in a push-pull driver is especially beneficial as it provides precharging of the output from either data state, it is contemplated that other output driver schemes may also benefit from the present invention, including those using passive pull-up devices, bipolar driver transistors, or configurations such as open drain or open collector drivers. Of course, the polarity of the signals controlling the driver transistors in these alternative arrangements may differ from that described herein for the case of a CMOS push-pull driver.

According to this embodiment of the invention, terminal DQ is precharged by one of p-channel pull-up transistor 12 and n-channel pull-down transistor 14, depending upon the prior data state in a manner controlled by control circuits 40u, 40d, respectively. Control circuits 40u, 40d each receive node DQ', which is coupled to terminal DQ via the ESD protection circuit of series resistor 31 and diode 33 (having its anode connected to terminal DQ and its cathode connected to $V_{cc}$); as will be described hereinbelow, the gate of the precharging one of driver transistors 12, 14 will be biased by way of node DQ' to avoid overshoot in the precharge operation. The ESD protection circuit of resistor 31 and diode 33 protects the relatively small transistors within control circuits 40u, 40d from any ESD event to which the large driver transistors 12, 14 cannot respond quickly enough.

Gated Schmitt trigger 42u generates a control signal on line SP to pull-up control circuit 40u; similarly, gated Schmitt trigger 42d generates a control signal on line SN to pull-down control circuit 40d. Pull-up control circuit 40u also receives inputs from output disable line OD (after inversion by inverter 45) and from data line ND; similarly, pull-down control circuit 40d receives additional inputs from output disable line OD and from data line ND. Data line ND is generated by sense amplifiers and column decoder 26, and thus carries a signal corresponding to the contents of the memory cell that is selected in the current memory cycle and associated with data terminal DQ. As will be described in further detail hereinbelow, control circuits 40u, 40d apply the proper bias voltage to the gates of driver transistors 12, 14 to present, when enabled, an output data state corresponding to the signal on line ND, and to place terminal DQ into a high impedance state when not enabled. Also as will be described hereinbelow, control circuits 40u, 40d also will control the gate of the one of the driver transistors 12, 14 opposite to the prior data state at terminal DQ, in order to effect precharge of terminal DQ.

As described hereinabove, control circuits 40u, 40d are biased by nodes PNAND, GNAND, PNOR, GNOR, in similar manner as described hereinabove relative to said copending application Ser. No. 601,288, filed Oct. 22, 1990, assigned to SGS-Thomson Microelectronics, Inc., and incorporated herein by reference.

Gated Schmitt triggers 42u, 42d generate control signals on line SP, SN, respectively, as noted hereinabove. As will be apparent in more detail hereinbelow, in this example a high logic level is to be generated on line SP during precharge from a previously low logic level, and a low logic level is to be generated on line SN during precharge from a previously high logic level. Upon terminal DQ becoming precharged to the proper voltage (and also during non-precharge operations), line SP will be low and line SN will be high. To effect this operation, terminal DQ is internally connected to each of gated Schmitt triggers 42u, 42d, so that gated Schmitt triggers 42u, 42d monitor and terminate the precharging of terminal DQ as will be described hereinbelow.

Terminal DQ is also connected to the input of prior cycle data latch 46, for storage of the output state of terminal DQ during the prior memory cycle. Prior cycle data latch 46 is enabled by a chip enable signal on chip enable complement line CEC, and is clocked by line GEQ. A low logic level on line GEQ is generated by GEQ generator 44 responsive to a pulse on line ATD indicating that an address transition has been detected at the beginning of a new memory cycle, remaining low throughout the duration of the precharge operation. Line GEQ, and complementary data line DLTCHC from the output of prior cycle data latch 46, each control gated Schmitt triggers 42u, 42d in the manner described hereinbelow.

Figure 4:
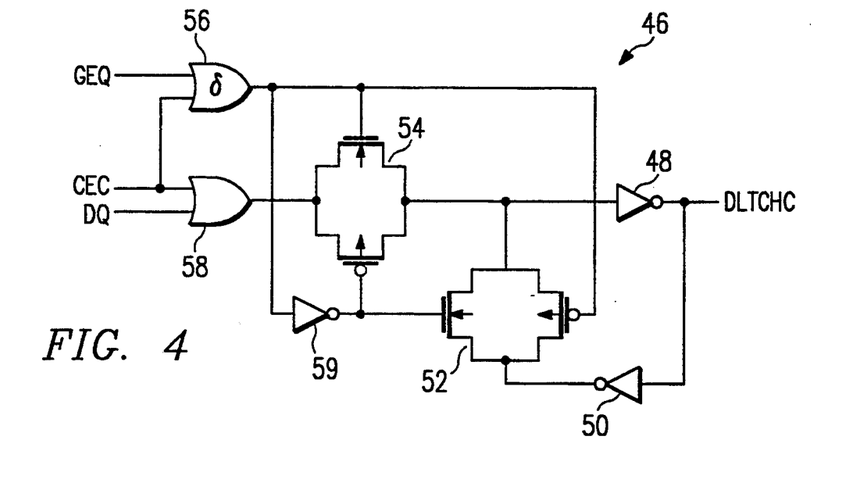
FIG. 4 is an electrical diagram, in schematic form, of the data latch in the circuit of FIG. 3.

The construction and operation of prior cycle data latch 46 will now be described in detail relative to FIG. 4. OR function 58 in prior cycle data latch 46 receives terminal DQ and chip enable complement line CEC (which indicates chip enable with a low logic level) at its inputs; the output of OR function 58 is coupled to one side of pass gate 54. Line GEQ is connected to an input of OR gate 56, as is chip enable complement line CEC. OR gate 56 includes a specified delay therein (or alternatively is implemented by delay stages connected to the output of a conventional OR gate), to properly control the latching of the state at terminal DQ as will be described hereinbelow. The output of OR gate 56 is connected in complementary fashion, by way of inverter 59, to the gates of complementary pass gate 52 and complementary pass gate 54, so that pass gate 52 is conductive and pass gate 54 is not conductive responsive to the output of OR gate 56 being low, and so that pass gate 54 is conductive and pass gate 52 is not conductive responsive to the output of OR gate 56 being high.

Inverters 48, 50 are coupled together in cross-coupled fashion to form a potential latch; in this case, the output of inverter 48 drives data complement line DLTCHC. Complementary pass gate 54 is coupled between the output of OR gate 58 and the input of latch inverter 48, while complementary pass gate 52 is coupled in the feedback loop between the output of inverter 50 and the input of inverter 48.

In operation, when memory 1 is not enabled (i.e., chip enable complement line CEC is high), the outputs of OR gate 56 and of OR gate 58 are both forced high. Pass gate 54 is thus forced on and pass gate 52 is forced off, such that the state latched by inverters 48, 50 receives a high logic level from OR gate 58 (which is a don't care state in this example). When memory 1 is enabled (i.e., line CEC is low), the output of OR gate 56 will depend on the state of line GEQ, and the output of OR gate 58 will depend upon the state of terminal DQ.

During such time as memory 1 is enabled, and prior to line GEQ going to a low logic level responsive to the initiation of a new cycle (e.g., a pulse on line ATD from ATD circuit 28 indicating detection of an address transition), the output of OR gate 56 is high, so that pass gate 54 is on and pass gate 52 is off. Accordingly, the state of terminal DQ is passed through OR gate 58 and inverter 48 to data complement line DLTCHC (line DLTCHC thus presenting the logical complement of the state of terminal DQ).

As noted hereinabove, line GEQ is at a low logic level during such time as precharge is to take place at the beginning of a cycle, for example responsive to a pulse on line ATD from ATD circuit 28 indicating an address transition. Line GEQ thus enables output precharge during such time as it remains low. Accordingly, after expiration of the specified delay therein, OR gate 56 turns on pass gate 52 and turns off pass gate 54 during the precharge operation. Since OR gate 58 responds to the state of terminal DQ when enabled, once pass gate 54 is turned off by OR gate 56, the data state present at terminal DQ (from the prior cycle) is latched by inverters 48, 50, with the feedback connection completed by pass gate 52. The state of data complement line DLTCHC thus remains at the complement of the logic level of terminal DQ in the prior cycle, and will not be affected by the precharging of terminal DQ as will be described hereinbelow.

Figure 5:
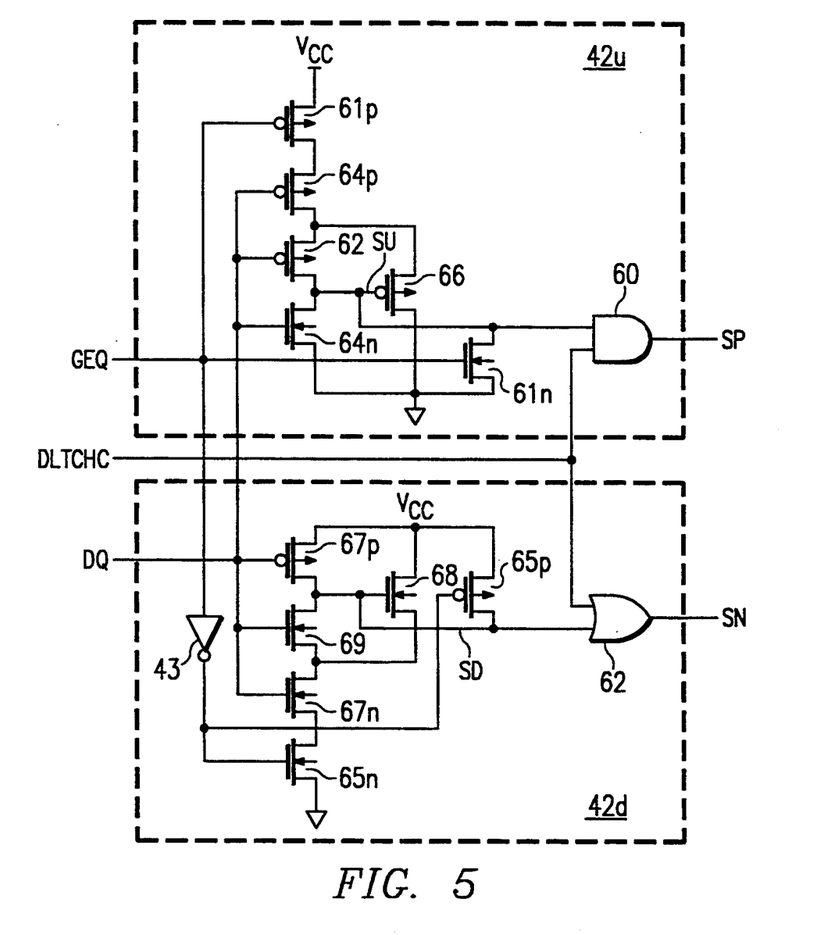
FIG. 5 is an electrical diagram, in schematic form, of the gated Schmitt triggers in the circuit of FIG. 3.

Referring now to FIG. 5, the construction and operation of gated Schmitt triggers 42u, 42d will now be described. While Schmitt triggers are used in this preferred embodiment of the present invention, it is of course understood that other level detector circuits may alternatively be used. Gated Schmitt trigger 42u includes AND gate 60 which drives line SP with its output. Conversely, gated Schmitt trigger 42d includes OR gate 62 which drives line SN with its output. As shown in FIG. 3, lines SP, SN are connected to control circuits 40u, 40d, respectively, for use in generating levels on lines P, PSRC and N, NSRC.

Gated Schmitt triggers 42u and 42d each receive a precharge signal on line GEQ (inverted by inverter 43 for the Schmitt trigger 42d) and the current state of terminal DQ on line DQ. Gated Schmitt triggers 42u, 42d also receive the output of prior cycle data latch 46 on data complement line DLTCHC at inputs of AND gate 60 and OR gate 62, respectively, by which the output of either one or the other of gated Schmitt triggers 42u, 42d (but not both) is enabled according to the logic level at terminal DQ from the prior cycle, and thus according to the initial condition of terminal DQ prior to precharge.

Schmitt trigger 42u includes series p-channel pull-up transistors 61p, 62, 64p with their source/drain paths connected in series to $V_{cc}$, and has parallel n-channel pull-down transistors 61n, 64n with their source/drain paths connected in parallel to ground, in conventional NOR fashion. The gates of transistors 61n, 61p are controlled by line GEQ, and the gates of transistors 62, 64p, 64n are controlled by line DQ. Node SU at which the drains of transistors 62, 64n, 61n are connected together is connected to a first input of AND gate 60. As such, Schmitt trigger 42u performs a NOR function of lines GEQ and DQ. Hysteresis is implemented into Schmitt trigger 42u in the conventional fashion, by connecting the source/drain path of transistor 66 in parallel between $V_{ss}$ and the source of transistor 62, and by connecting the gate of transistor 66 to output node SU.

In operation, Schmitt trigger 42u will operate dependent upon the level at terminal DQ only during precharge (line GEQ low), as a high logic level on line GEQ forces a low logic level to be presented to AND gate 60, thus ensuring that line SP is low during portions of the cycle other than precharge. During precharge (i.e., while line GEQ is low), gated Schmitt trigger 42u can only present a high logic level on line SP (enabling precharge) when data complement line DLTCHC is high, as a low logic level on data complement line DLTCHC (i.e., a high logic level output was presented in the prior cycle) forces the output of AND gate 60 low.

During precharge (line GEQ low) and where the prior state of terminal DQ is low (as latched by prior cycle data latch 46 and presented as a high level on data complement line DLTCHC), the voltage at terminal DQ controls the state of line SP in conventional Schmitt trigger fashion. With line DQ at ground, p-channel transistors 64p, 62 (and transistor 61p due to line GEQ low) are on, pulling node SU to $V_{cc}$ and turning off transistor 66. Referring to FIG. 5, a high level at node SU causes a high level on line SP (data complement line DLTCHC being high), which will enable p-channel pull-up transistor 12 to be turned on via control circuit 40u, as will be described hereinbelow, pulling terminal DQ toward $V_{cc}$, in turn raising the level of line DQ to Schmitt trigger 42u.

At such time as the voltage at terminal DQ reaches a voltage sufficient to turn on n-channel transistor 64n (on the order of 1.2 volts, for example), node SU will discharge toward ground, causing AND gate 60 to again present a low logic level at its output and turn off transistor 32. As will be noted hereinbelow, this will effectively end the precharge of terminal DQ. Once node SU is low, shorting transistor 66 will be on, incorporating hysteresis into the transfer characteristic in conventional Schmitt trigger fashion; as such, the switching voltage of terminal DQ required for again pulling node SU high is significantly lower (e.g., on the order of 0.3 volts lower) than that at which it discharged node SU. This prevents noise at terminal DQ during precharge from turning transistor 32 back on, and reduces the likelihood of oscillation.

Gated Schmitt trigger 42d is constructed and operates similarly as, but conversely to, gated Schmitt trigger 42u. OR gate 62 receives data complement line DLTCHC at one input, receives node SD at its other input, and drives node SN with its output, controlling the precharge by way of pull-down transistor 14. P-channel pull-up transistor 65p and n-channel pull-down transistor 65n each have their gates controlled by line GEQ (inverted by inverter 43). P-channel pull-up transistor 67p, having its source/drain path in parallel with transistor 65p, and n-channel pull-down transistors 67n and 69, having their source/drain paths in series with one another and in series with transistor 65n, each have their gates controlled by terminal DQ. Node SD, connected to the drains of p-channel transistor 67p and n-channel transistor 69, is connected to an input of OR gate 62. As such, node SD is substantially the logical NAND of terminal DQ and inverted line GEQ. P-channel transistor 68 has its gate connected to node SD, and has its source/drain path connected between the drain of transistor 67n and $V_{cc}$, for introducing hysteresis into the transfer characteristic of Schmitt trigger 42d.

In operation, OR gate 62 is enabled to respond to the state of node SD only when the latched output from the prior cycle on data complement line DLTCHC is low, indicating that the initial condition of terminal DQ is at a high logic level. In addition, the state of node SD is enabled to respond to the voltage at terminal DQ only during precharge, when line GEQ is at a low logic level. In the example where terminal DQ begins precharge at a high logic level, node SD is initially at a low logic level, causing OR gate 62 to present a low logic level on line SN and enabling precharge of terminal DQ via pull-down transistor 14, as will be described hereinbelow. As transistor 14 discharges terminal DQ to a low voltage, below the switching level of Schmitt trigger 42d, transistor 67p turns on and transistor 67n turns off; an example of the voltage at which this occurs is on the order of 2.0 volts. At this voltage, node SD is pulled up toward $V_{cc}$, causing OR gate 62 to present a high level output and turn off transistor 34. In addition, the high level at node SD turns on transistor 68, such that terminal DQ must exceed a higher voltage, for example on the order of 2.3 volts, in order for node SD to be pulled low again. Accordingly, gated Schmitt trigger 42d also provides immunity during precharge against noise on terminal DQ, thus reducing the risk of output oscillation.

Figure 6:
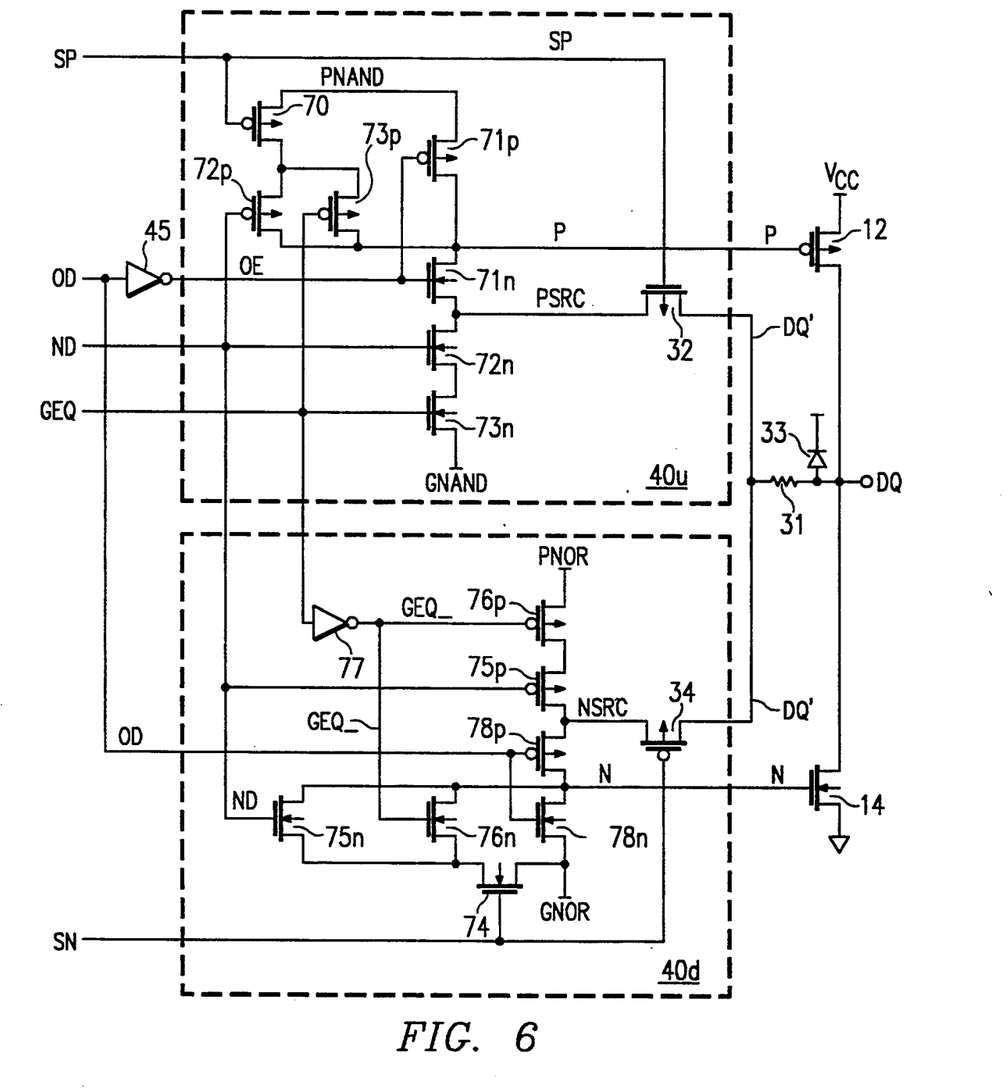
FIG. 6 is an electrical diagram, in schematic form, of the pull-up and pull-down control circuits in the circuit of FIG. 3.

Referring now to FIG. 6, the construction and operation of control circuits 40u, 40d will be described in detail. As noted hereinabove relative to FIG. 3, each of control circuits 40u, 40d are biased by nodes PNAND, GNAND, and nodes PNOR, GNOR, respectively, which are biased through single resistor networks to $V_{cc}$ and ground as described hereinabove relative to FIG. 1, and in copending application Ser. No. 601,288, filed Oct. 22, 1990, assigned to SGS-Thomson Microelectronics, Inc., and incorporated herein by reference. Each of control circuits 40u, 40d receive a precharge input on line GEQ, a new data value on line ND, the voltage at the output terminal DQ via node DQ', and an output disable signal on line OD (inverted by inverter 45 for control circuit 40u). In addition, pull-up control circuit 40u receives an input on line SP from gated Schmitt trigger 42u, and pull-down control circuit 40d receives an input on line SN from gated Schmitt trigger 42d.

Control circuits 40u, 40d are for biasing the gate of a respective one of driver transistors 12, 14 by way of lines P, N, respectively, for a data terminal DQ. Such control is effected not only during normal operation, during which a data state is to be driven at its respective terminal DQ, but also during precharge, as will be described hereinabove.

Referring first to pull-up control circuit 40u, p-channel transistor 70 has its source biased by node PNAND and its gate controlled by line SP from gated Schmitt trigger 42u. The drain of transistor 70 is connected to the sources of p-channel transistors 72p and 73p, which have their drains connected together to node P; the gates of transistors 72p, 73p are connected to line ND and GEQ, respectively. Node P is also connected to the drain of p-channel transistor 71p, which has its source biased by node PNAND and its gate controlled by output disable line OD (after inversion by inverter 45). N-channel transistor 71n has its source/drain path connected between node P and node PSRC, and has its gate connected to line OE from inverter 45. N-channel transistors 72n, 73n have their source/drain paths connected between node PSRC and ground bias node GNAND, and have their gates controlled by new data line ND, and line GEQ, respectively. The source/drain path of n-channel transistor 32 is connected between node PSRC and node DQ', and its gate is controlled by line SP from gated Schmitt trigger 42u.

Pull-down control circuit 40d is constructed in a similar, but converse, manner relative to pull-up control circuit 40u, for controlling the state of line N, which is coupled to the gate of pull-down transistor 14. P-channel transistors 76p, 75p, have their source/drain paths connected in series between bias node PNOR and node NSRC, and have their gates connected to line GEQ (inverted by inverter 77) and data line ND, respectively. P-channel transistor 78p has its source drain path connected between node NSRC and node N, and has its gate connected to line OD. N-channel transistors 75n, 76n, 78 each have their drain connected to node N. The sources of transistors 75n, 76n are connected together and to the drain of transistor 74, while the source of transistors 74 and 78n are connected together at node GNOR. The gates of transistor 75n, 76n, 78n, are connected to lines ND, GEQ (after inversion) and line OD, respectively, while the gate of transistor 74 is controlled by line SN. P-channel transistor 34 has its source/drain path connected between node NSRC and node DQ', and has its gate also controlled by line SN from gated Schmitt trigger 42d.

Each of control circuits 40u, 40d are thus complex gates, having inputs on lines OD, ND, GEQ, and SP, SN, respectively, from which the state of lines P, N, respectively, are derived. For ease of explanation, the truth tables of control circuits 40u, 40d are set forth hereinbelow relative to Tables 1 and 2, respectively.

TABLE 1

Truth Table of Control Circuit 40u

| Inputs | | | | Output |
|---|---|---|---|---|
| OD | ND | GEQ | SP | P |
| 0 | X | 0 | 1 | DQ |
| 0 | X | 0 | 0 | 1 |
| 0 | 1 | 1 | 0 | 0 |
| 0 | 0 | 1 | 0 | 1 |
| 1 | X | X | X | 1 |

As noted hereinabove, gated Schmitt trigger 42u forces line SP low responsive to line GEQ high.

TABLE 2

Truth Table of Control Circuit 40d

| Inputs | | | | Output |
|---|---|---|---|---|
| OD | ND | GEQ | SN | N |
| 0 | X | 0 | 0 | DQ |
| 0 | X | 0 | 1 | 0 |
| 0 | 1 | 1 | 1 | 0 |
| 0 | 0 | 1 | 1 | 1 |
| 1 | X | X | X | 0 |

As noted hereinabove, gated Schmitt trigger 42d forces line SN high responsive to line GEQ high.

Figure 7:
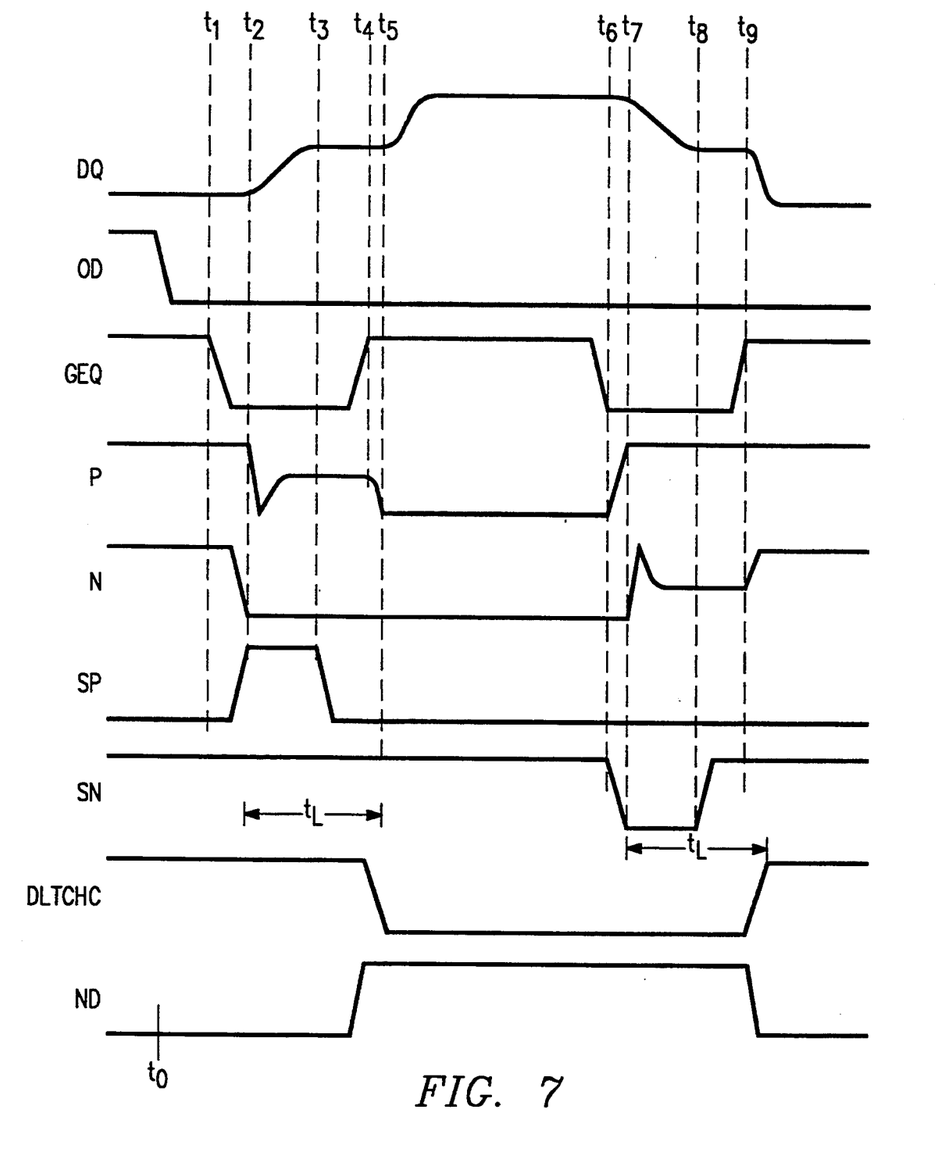
FIG. 7 is a timing diagram illustrating the operation of the circuit of FIG. 3.

Referring now to FIG. 7 in combination with FIGS. 3 and 6, the overall operation of the present embodiment of the invention will be described. This example of the operation will be described first for an output transition from a low logic level to a high logic level, followed by an output transition from a high logic level to a low logic level in the following operating cycle. The rail-to-rail transitions are described herein to show the worst case switching time at output terminal DQ. Of course, since control circuits 40 cannot know the next data state prior to its access, precharge will similarly occur, and a slight output dip will be observed, between successive cycles in which the same data state is output at terminal DQ.

In this example, terminal DQ has been initially driven to a low logic level at time $t_0$. Nodes P and N are thus at a high logic level, such that driver transistor 12 is off and driver transistor 14 is on. As described hereinabove, line GEQ is at a high logic level prior to precharge, and thus node SP is low and node SN is high, by operation of gated Schmitt triggers 42u, 42d.

In pull-up control circuit 40u, during such time as line GEQ is high, indicating that operation is not in precharge, line SP will necessarily be at a low logic level, as described hereinabove relative to gated Schmitt trigger 42u. Accordingly, transistors 70 and 73n will be on and transistor 73p will be off. Assuming that the output is enabled by line OD being low (and line OE high), transistor 71p will be off and transistor 71n will be on. Accordingly, a low logic level on line ND, indicating that a low logic level is to be driven onto terminal DQ, will turn on transistor 72p and turn off transistor 72n, driving line P high, and turning off transistor 12. During this time in pull-down control circuit 40d, line GEQ is low and line SN is high, turning on transistors 74 and 76p and turning off transistor 76n. With line OD low because the output is enabled, transistor 78p is on and transistor 78n is off. Accordingly, since node ND is low, transistor 75p is turned on and pulls node N to a high level, which turns on pull-down transistor 14 (FIG. 3), pulling down terminal DQ to the desired low logic level.

Of course, if a high logic level were being presented (if line ND were high), line P would be low since transistor 72p would be off and transistor 72n would be on, turning on pull-up transistor 12 and pulling terminal DQ high. Conversely, in pull-down control circuit 40d, transistor 75p would be off and transistor 75n would be on, pulling node N low and turning off pull-down transistor 14.

If the output is to be disabled, line OD will be driven high, turning off transistor 71n and turning on transistor 71p, pulling line P high and turning off transistor 12. Similarly, a high level on line OD turns on transistor 78n and turns off transistor 78p in pull-down control circuit 40d, forcing node N to a low logic level and ensuring that transistor 14 remains off. With both transistors off, terminal DQ is at a high impedance state, allowing another device to control the external bus or, in the case of a common input/output terminal, allowing a data state to be received.

Referring back to FIG. 7, after detection of an address transition by ATD circuit 28, GEQ generator 44 issues a low logic level on line GEQ, shown at time $t_1$. It is quite important that the timing of the enabling of the GEQ pulse and its duration be carefully selected to ensure sufficient precharge time, but not to adversely affect output hold times (as it would if precharge begins too early). In addition, the GEQ pulse must be disabled at the appropriate time relative to the presentation of new data in the next read cycle, as premature disabling of the GEQ pulse can result in the application of false data, while late disabling of the pulse can result in pushout of the access time. In the case of a high speed SRAM, the GEQ low logic level pulse should end approximately one nsec before the next value of read data is sensed for the next cycle (shown as the transition on line ND in FIG. 7).

Also responsive to line GEQ going low, the prior (low level) state of terminal DQ is stored by prior cycle data latch 46 and maintained on data complement line DLTCHC over time $t_L$ despite any transition on line ND. Gated Schmitt trigger 42u is thus enabled by the high level on data complement line DLTCHC, the low level on line GEQ, and the current low level on terminal DQ, to drive line SP high, also occurring at approximately time $t_2$.

Pull-up control circuit 40u is now enabled to control the precharge of terminal DQ by controlling the bias of the gate of transistor 12 on line P. With the output enabled (line OE high), transistor 71n is on. The low level on line GEQ turns off transistor 73n and turns on transistor 73p. As noted hereinabove, node SP is driven by Schmitt trigger 42u to a high logic level during precharge since, in this example, the prior state of terminal DQ was low, turning on transistor 32. Node PSRC is thus connected to node DQ' so that, in turn, the voltage at terminal DQ is coupled to node P through transistors 32, 71n, biasing transistor 12 with a low voltage and turning it on. Terminal DQ thus begins to be pulled high by transistor 12, which node P follows as shown in FIG. 7.

The coupling of terminal DQ to node P via node DQ' and transistors 32, 71n provides the important advantage of self-limiting the precharge of terminal DQ. If the voltage at terminal DQ, coupled to node P through transistors 32 and 71n, exceeds $V_{cc}$ minus the threshold voltage of transistor 12, transistor 12 will turn itself off. This coupling of the output terminal voltage to the gate of the pull-up transistor thus reduces the risk of overshooting the precharge voltage.

Also during this time, the low level pulse on line GEQ at time $t_1$ causes node N to be driven low at time $t_2$. This occurs as a result of line SN from gated Schmitt trigger 42d being maintained high during precharge where the prior data state was low, as in this case. As a result, transistor 34 remains off but transistor 74 remains on. The high logic level on line $GEQ_{13}$ during precharge turns on transistor 76n, pulling node N low to node GNOR through transistors 74 and 76n, turning off n-channel pull-down transistor 14. In addition, the high level on line SN ensures that, during precharge, pull-down transistor 14 is prevented from turning on, thus precluding oscillation at terminal DQ during precharge which could occur if both of transistors 12, 14 could be activated during a single precharge operation.

At such time as the voltage of terminal DQ reaches the trip point of gated Schmitt trigger 42u, shown as time $t_3$ in FIG. 7, line SP returns to a low logic level, turning off transistor 32 and turning on transistor 70, pulling line P high. Transistor 12 is thus turned off, allowing terminal DQ to remain at an intermediate level for the remainder of the precharge period. However, if the voltage at terminal DQ falls to a low voltage outside the hysteresis of gated Schmitt trigger 42u, gated Schmitt trigger 42u will again drive line SP to a high level, turning on transistor 32 so that the low voltage at terminal DQ again turns on transistor 12. The noise immunity provided by the hysteresis of gated Schmitt trigger 42u, precludes rapid oscillation of line SP, and thus of pull-up transistor 12 and terminal DQ.

Furthermore, the disabling of gated Schmitt trigger 42d and transistor 34 during precharge after a cycle in which terminal DQ was low prevents both oscillation at terminal DQ, as transistor 14 cannot be turned on during this precharge operation. A crowbar condition in which both driver transistors 12, 14 are on is also prevented by the disabling of gated Schmitt trigger 42d in this embodiment of the invention.

As noted hereinabove, the next data level is received on line ND (in this example, a high logic level at time $t_4$) during the precharge operation, with the end of the precharge operation (communicated on line GEQ) occurring substantially at this time. Upon the completion of the precharge operation at time $t_4$, at such time as line GEQ returns to a high logic level, line SP is forced low, ensuring that transistor 32 is off and transistor 70 is on even if the precharge was incomplete. The new high level data state available on line ND at this time causes node P to be driven low by pull-up control circuit 40u, since transistors 72n and 73n are both on (transistor 71n remaining on as the output is enabled). Responsive to node P going low and turning on pull-up transistor 12, terminal DQ begins its transition to a high logic level, at time $t_5$.

Precharge for the opposite transition occurs in a similar manner. Beginning at time $t_6$, precharge is again initiated by line GEQ going to a low logic level, latching the prior output data state into prior cycle data latch 46. Line GEQ going low turns off transistor 73n and turns on transistor 73p in pull-up control circuit 40u. As in the prior case, the high logic level is latched in by prior cycle data latch 46, and communicated as a low logic level on line DLTCHC to gated Schmitt triggers 42u, 42d, enabling gated Schmitt trigger 42d and disabling gated Schmitt trigger 42u. Line SP thus remains low during precharge for this transition, since the prior latched data state is a high logic level (forcing the output of AND gate 60 low), which turns off transistor 32 and turns on transistor 70. Node P is thus driven to a high level through transistors 73p and 70, occurring at time $t_7$, turning off transistor 12 throughout this precharge operation.

In pull-down control circuit 40d, the low level on line GEQ turns off transistor 76p and turns on transistor 76n. During precharge after a cycle in which terminal DQ was high, and thus in which node N was low, node SN from gated Schmitt trigger 42d will be driven low, turning off transistor 74 and turning on transistor 34 in pull-down control circuit 40d. Node NSRC is thus coupled to the voltage at output terminal DQ, via node DQ'. Since transistor 78p is on (the output being enabled), the voltage at terminal DQ is thus applied to node N, and the gate of transistor 14. Since the state of terminal DQ is initially high at this time, transistor 14 will turn on and will begin to discharge terminal DQ to ground. The voltage at node N will follow this discharging, as shown in FIG. 7 from time $t_7$ to time $t_8$.

The discharging of terminal DQ through transistor 14 continues to an intermediate voltage, namely the voltage at which gated Schmitt trigger 42d changes states (time $t_8$ of FIG. 7), and drives node SN back to a high logic level, turning off transistor 34 and turning on transistor 74. Node N is pulled low at this time, turning off transistor 14 (if the precharge operation has not already terminated at this time). In addition, the coupling of terminal DQ to node N prevents undershoot of the precharge voltage below the threshold voltage of transistor 14, as in such case transistor 14 would be turned off.

Upon termination of the precharge operation line, at time $t_9$, indicated by line GEQ going high, the new data state on line ND (in this case a low logic level) will cause pull-down control circuit 40d to drive line N high, turning on pull-down transistor 14, and discharging terminal DQ to ground.

The intermediate precharge accomplished by the present invention thus reduces the time required for the output drivers to fully switch output terminal DQ, as the magnitude of the switching voltage driven by the output driver (i.e., transistors 12, 14) is reduced by nearly one-half. Furthermore, the intermediate precharge can be performed during a time in the memory cycle at which data is not yet available at the output drivers. In addition, since the differential voltage that is to be driven by the output drivers is reduced, the transient noise generated by memory 1 according to the present invention is also much reduced.

For example, simulations using nominal model conditions have indicated as much as a 50% improvement in the worst case delay time through the output buffer when using the embodiment of the invention described hereinabove, as opposed to the prior arrangement discussed and illustrated in FIG. 1 hereof, all other factors remaining equal. In addition, simulations have shown significant reduction in the magnitude of worst case transient noise on the ground lines, such reduction being on the order of 0.50 volts (1.25 volts versus 0.73 volts), again comparing the embodiment of the invention described hereinabove as compared against the prior scheme of FIG. 1, all other factors remaining equal.

Furthermore, the improvement in speed and reduction in noise is obtained with minimal risk of oscillation, overshoot, and the like, and also with minimal risk of output buffer crowbar current, in contrast to the scheme disclosed in the Okuyuma, et al. article discussed hereinabove. The effects of oscillation and crowbar current are especially disastrous for low power integrated circuits, such as are necessary in portable computers and the like.

Potential crowbar conditions through the driver transistors are eliminated by the latching of the prior data state in a prior cycle data latch, by which the precharge circuitry is enabled according to the prior data state. Once the prior data state is latched, the output driver transistor that drove the prior data state is turned off, thus allowing the opposite driver transistor to precharge the output without entering a crowbar condition. Furthermore, overshoot during precharge is eliminated by the coupling of the output terminal to the gate of the precharging driver transistor, such that overshoot of the precharge voltage will itself turn off the precharging driver transistor. The risk of oscillation is also reduced by enabling precharge from only one side, depending on the prior data state, and by including hysteresis in the transfer characteristic of the precharge control circuit (e.g., the gated Schmitt trigger).

Accordingly, the present invention is particularly beneficial for integrated circuits intended in applications such as low power integrated circuits, especially used in low power applications such as portable computers and the like, for which crowbar current and oscillation are particularly undesirable. In addition, the present invention allows wide output (e.g., 16 or 32 bit outputs) devices to have fast switching outputs, as the noise generated by output switching is much reduced by the present invention.

It should also be noted that the circuit of the preferred embodiment may turn on, during precharge, the driver transistor most recently turned on to drive the output, in the case where the previous cycle was aborted prior to the output terminal reaching a full logic level. As such, the precharge is performed in this embodiment of the invention according to the actual data state at the output terminal, rather than according to an assumed data state thereat. While it is contemplated that the present invention may be implemented so that the driver transistor most recently turned on during an active (non-precharge) operation is the transistor turned off in the next precharge operation, the latching and comparison of the output terminal itself used in the embodiment described hereinabove is preferred, as it accounts for incomplete cycle operations.

According to an alternative embodiment of the present invention, prior cycle data latch 46 would not be used to retain the prior cycle output data state. Instead, if the trip voltages of the Schmitt triggers (or other level detector circuit with hysteresis) were set at sufficiently different voltages, only one of the driver transistors 12, 14 would be turned on for a given precharge operation. While the other Schmitt trigger would not be forced off as in the case of the preferred embodiment of the invention described hereinabove, it would be prevented from turning on its associated driver transistor during precharge if the output terminal (driven by the opposing driver transistor) never reached the trip point.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An output driver for an integrated circuit, comprising:
   a first driver transistor, having a conduction path connected between a first bias voltage and an output terminal, and having a control terminal;
   a memory for storing a data state corresponding to the voltage at said output terminal, said memory having an input coupled to said output terminal;
   a first driver control circuit, having a data input, having a control input for receiving a precharge signal, having an input coupled to the output of said memory, and having an output coupled to the control terminal of said first driver transistor, said first driver control circuit:
   for turning off said first driver transistor responsive to said precharge signal in combination with the contents of said memory being at a first data state having a logic level corresponding to said first bias voltage;
   for turning on said first driver transistor responsive to said precharge signal in combination with the contents of said memory being at a second data state having a logic level corresponding to a second bias voltage; and
   for turning on said first driver transistor responsive to the absence of said precharge signal in combination with receiving said first logic state at its data input.

2. The output driver of claim 1, wherein said memory comprises:
   a latch, having a data input coupled to said output terminal, and having a control input for receiving said precharge signal so that a data state corresponding to the voltage at said output terminal is latched into said latch responsive to said precharge signal.

3. The output driver of claim 1, wherein said first driver control circuit comprises:
   a gated level detector, having an input coupled to the output terminal, and having an enable input coupled to said memory so as to be enabled responsive to the contents of said memory being at said second data state;

a logic circuit, having an input for receiving said precharge signal, and coupled to said gated level detector, for turning on said first driver transistor responsive to said gated level detector indicating, when enabled, that said output terminal is at a voltage substantially different from said first bias voltage.

4. The output driver of claim 3, wherein said logic circuit comprises:

a pass transistor having a conduction path coupled between said output terminal and the gate of said first driver transistor, and having its control terminal coupled to said gated level detector, so that said pass transistor is conductive responsive to said gated level detector indicating, when enabled, that said output terminal is at a voltage substantially different from said first bias voltage.

5. The output driver of claim 1, further comprising:

a second driver transistor, having a conduction path connected between said second bias voltage and said output terminal, and having a control terminal;

a second driver control circuit, having a data input, having a control input for receiving said precharge signal, having an input coupled to the output of said memory, and having an output coupled to the control terminal of said second driver transistor, said second driver control circuit:

for turning off said second driver transistor responsive to said precharge signal in combination with the contents of said memory being at said second data state;

for turning on said second driver transistor responsive to said precharge signal in combination with the contents of said memory being at said first data state; and for turning on said second driver transistor responsive to the absence of said precharge signal in combination with receiving said second logic state at its data input.

6. The output driver of claim 5, wherein said first driver control circuit comprises:

a first gated level detector, having an input coupled to the output terminal, and having an enable input coupled to said memory so as to be enabled responsive to the contents of said memory being at said second data state; and a first logic circuit, having an input for receiving said precharge signal, and coupled to said first gated level detector, for turning on said first driver transistor responsive to said first gated level detector indicating, when enabled, that said output terminal is at a voltage substantially different from said first bias voltage;

and wherein said second driver control circuit comprises:

a second gated level detector, having an input coupled to the output terminal, and having an enable input coupled to said memory so as to be enabled responsive to the contents of said memory being at said first data state;

a second logic circuit, having an input for receiving said precharge signal, and coupled to said second gated level detector, for turning on said second driver transistor responsive to said second gated level detector indicating, when enabled, that said output terminal is at a voltage substantially different from said second bias voltage.

7. An output driver circuit, comprising:

a pull-up transistor having a conduction path coupled between a power supply voltage and an output terminal, and having a control terminal;

a pull-down transistor having a conduction path coupled between a reference voltage and said output terminal, and having a control terminal;

a pull-up control circuit, having a data input for receiving a data signal, having an output coupled to the control terminal of said pull-up transistor, for controlling said pull-up transistor to drive said output terminal toward said power supply voltage responsive to said data signal at a first logic state;

a pull-down control circuit, having a data input for receiving a data signal, having an output coupled to the control terminal of said pull-down transistor, for controlling said pull-down transistor to drive said output terminal toward said reference voltage responsive to said data signal at a second logic state;

means for generating a precharge signal indicating the initiation of a new cycle;

means for storing, responsive to said precharge signal, the logic state at said output terminal;

a first level detector circuit, having an input coupled to said output terminal, having control inputs for receiving said precharge signal and for receiving the contents of said storing means so that said first level detector circuit is enabled responsive to said precharge signal in combination with said storing means storing said second logic state, and having an output coupled to said pull-up control circuit;

a second level detector circuit, having an input coupled to said output terminal, and having control inputs for receiving said precharge signal and for receiving the contents of said storing means so that said second level detector circuit is enabled responsive to said precharge signal in combination with said storing means storing said first logic state, and having an output coupled to said pull-down control circuit;

wherein said pull-up control circuit turns on said pull-up transistor responsive to said first level detector circuit indicating that the voltage at said output terminal is substantially different from the power supply voltage;

and wherein said pull-down control circuit turns on said pull-down transistor responsive to said second level detector circuit indicating that the voltage at said output terminal is substantially different from the reference voltage.

8. The output driver of claim 7, wherein said first and second level detector circuits each comprise a gated Schmitt trigger.

9. The output driver of claim 7, wherein said pull-up control circuit comprises:

a pass transistor, having a conduction path coupled between said output terminal and the control terminal of said pull-up transistor, and having a control terminal coupled to said first level detector circuit, so that said control terminal of said pull-up transistor is biased from said output terminal responsive to said first level detector circuit indicating that the voltage at said output terminal is substantially different from said power supply voltage.

10. The output driver of claim 9, wherein said pull-up transistor is a field effect transistor of a conductivity type such that it is turned off responsive to a voltage near said power supply voltage being applied to its gate.

11. The output driver of claim 10, wherein said pull-down control circuit comprises:
a pass transistor, having a conduction path coupled between said output terminal and the control terminal of said pull-down transistor, and having a control terminal coupled to said second trigger circuit, so that said control terminal of said pull-down transistor is biased from said output terminal responsive to said second trigger circuit indicating that the voltage at said output terminal is substantially different from said reference voltage;
wherein said pull-down transistor is a field effect transistor of a conductivity type such that it is turned off responsive to a voltage near said reference voltage being applied to its gate.

12. An integrated circuit, comprising:
functional circuitry for performing a data processing operation, said functional circuitry having an output;
an output terminal;
a first driver transistor, having a conduction path connected between a first bias voltage and said output terminal, and having a control terminal;
a memory for storing a data state corresponding to the voltage at said output terminal, said memory having an input coupled to said output terminal;
a first driver control circuit, having a data input coupled to the output of said functional circuitry, having a control input for receiving a precharge signal, having an input coupled to the output of said memory, and having an output coupled to the control terminal of said first driver transistor, said first driver control circuit:
for turning off said first driver transistor responsive to said precharge signal in combination with the contents of said memory being at a first data state having a logic level corresponding to said first bias voltage;
for turning on said first driver transistor responsive to said precharge signal in combination with the contents of said memory being at a second data state having a logic level corresponding to a second bias voltage; and
for turning on said first driver transistor responsive to the absence of said precharge signal in combination with receiving said first logic state from said functional circuitry.

13. The integrated circuit of claim 12, further comprising:
a second driver transistor, having a conduction path connected between said second bias voltage and said output terminal, and having a control terminal;
a second driver control circuit, having a data input coupled to the output of said functional circuitry, having a control input for receiving said precharge signal, having an input coupled to the output of said memory, and having an output coupled to the control terminal of said second driver transistor, said second driver control circuit:
for turning off said second driver transistor responsive to said precharge signal in combination with the contents of said memory being at said second data state;
for turning on said second driver transistor responsive to said precharge signal in combination with the contents of said memory being at said first data state; and
for turning on said second driver transistor responsive to the absence of said precharge signal in combination with receiving said second logic state from said functional circuitry.

14. The integrated circuit of claim 12, further comprising:
input circuitry coupled to said output terminal, for communicating an input signal received at said output terminal to said functional circuitry during write operations thereto.

15. A method of controlling a push-pull output driver for driving the output terminal of an integrated circuit, said push-pull output driver including a pull-up transistor connected between a power supply voltage corresponding to a first logic level and said output terminal, and including a pull-down transistor connected between a reference voltage corresponding to a second logic level and said output terminal, each of said pull-up and pull-down transistors having a control terminal, comprising the steps of:
responsive to an operating cycle of said integrated circuit indicating that the output terminal is to communicate a data state, driving said output terminal to a logic level by turning on the one of said pull-up and pull-down transistors corresponding to the data state to be communicated;
detecting the initiation of a new operating cycle of said integrated circuit;
responsive to said detecting step, turning off the one of said pull-up and pull-down transistors turned on in said driving step;
after the turning off step, turning on a pass transistor having a source-drain path coupled on one side to the output terminal and on another side to the control terminal of the one of said pull-up and pull-down transistors that is biased to drive the output terminal to the opposite logic level from that at the output terminal so as to couple the voltage at the output terminal to the control terminal of the one of said pull-up and pull-down transistors; and
responsive to said output terminal reaching a selected voltage between said power supply voltage and said reference voltage, turning off the one of said pull-up and pull-down transistors to which the voltage at the output terminal is coupled in the turning on step.

16. A method of controlling a push-pull output driver for driving the output terminal of an integrated circuit, said push-pull output driver including a pull-up transistor connected between a power supply voltage corresponding to a first logic level and said output terminal, and including a pull-down transistor connected between a reference voltage corresponding to a second logic level and said output terminal, each of said pull-up and pull-down transistors having a control terminal, comprising the steps of:
responsive to an operating cycle of said integrated circuit indicating that the output terminal is to communicate a data state, driving said output terminal to a logic level by turning on the one of said pull-up and pull-down transistors corresponding to the data state to be communicated;
detecting the initiation of a new operating cycle of said integrated circuit;

responsive to said detecting step, turning off the one of said pull-up and pull-down transistors turned on in said driving step;

after the turning off step, turning on the one of said pull-up and pull-down transistors that is biased to drive the output terminal to the opposite logic level from that previously driven at the output terminal;

responsive to said output terminal reaching a selected voltage between said power supply voltage and said reference voltage, turning off the one of said pull-up and pull-down transistors turned on in the turning on step;

detecting an output disable signal applied to said integrated circuit; and responsive to said output disable signal, turning off both of said pull-up and pull-down transistors.

17. An output driver for an integrated circuit, comprising:

a first driver transistor, having a conduction path connected between a first bias voltage and an output terminal, and having a control terminal;

a first driver control circuit, having a data input, having a control input for receiving a precharge signal indicating precharge, having an input coupled to an output terminal, and having an output coupled to the control terminal of said first driver transistor, said first driver control circuit:

for turning off said first driver transistor during precharge responsive to the voltage at said output terminal being nearer said first bias voltage than a first off trip point;

for turning on said first driver transistor during precharge responsive to the voltage at said output terminal being nearer a second bias voltage than a first on trip point; and when not in precharge, for turning on said first driver transistor responsive to receiving said first logic state at its data input;

a second driver transistor, having a conduction path connected between said second bias voltage and said output terminal, and having a control terminal;

a second driver control circuit, having a data input, having a control input for receiving said precharge signal, having an input coupled to the output terminal, and having an output coupled to the control terminal of said second driver transistor, said second driver control circuit:

for turning off said second driver transistor during precharge responsive to the voltage at said output terminal being nearer said second bias voltage than a second off trip point;

for turning on said second driver transistor during precharge responsive to the voltage at said output terminal being nearer said first bias voltage than a second on trip point; and when not in precharge, for turning on said second driver transistor responsive to receiving said second logic state at its data input;

wherein said first on and second on trip points are at substantially different voltages from one another.

18. The output driver of claim 17, wherein said first on trip point is nearer said second bias voltage than said second on trip point, and said second on trip point is nearer said first bias voltage than said first on trip point.

19. The output driver of claim 18, wherein said first off trip point is nearer said first bias voltage than said first on trip point;

wherein said first driver control circuit is also for:

responsive to turning on said first driver transistor during precharge, maintaining said first driver transistor on until the voltage at said output terminal reaches said first off trip point;

wherein said second off trip point is nearer said second bias voltage than said second on trip point;

and wherein said second driver control circuit is also for:

responsive to turning on said second driver transistor during precharge, maintaining said second driver transistor on until the voltage at said output terminal reaches said second off trip point.

20. The output driver of claim 19, wherein said first and second driver control circuits each comprise a Schmitt trigger.

21. The output driver of claim 17, further comprising:

prior cycle data storing means, having a data input coupled to said output terminal, having an output, and having a control input for receiving said precharge signal so that a data state corresponding to the voltage at said output terminal is latched into said prior cycle data storing means responsive to said precharge signal;

wherein the output of said prior cycle storing means is coupled to said first and second driver control circuits in such a manner that said first driver control circuit is disabled responsive to the stored data state corresponding to said first bias voltage, and in such a manner that said second driver control circuit is disabled responsive to the stored data state corresponding to said second bias voltage.

22. A method of controlling a push-pull output driver for driving the output terminal of an integrated circuit, said push-pull output driver including a pull-up transistor connected between a power supply voltage corresponding to a first logic level and said output terminal, and including a pull-down transistor connected between a reference voltage corresponding to a second logic level and said output terminal, each of said pull-up and pull-down transistors having a control terminal, comprising the steps of:

responsive to an operating cycle of said integrated circuit indicating that the output terminal is to communicate a data state, driving said output terminal to a logic level by turning on the one of said pull-up and pull-down transistors corresponding to the data state to be communicated;

latching the logic level at the output terminal;

detecting the initiation of a new cycle of said functional circuitry;

responsive to said detecting step, turning off the one of said pull-up and pull-down transistors turned on in said driving step;

after the turning off step, turning on the one of said pull-up and pull-down transistors that is biased to drive the output terminal to the opposite logic level from that latched in the latching step; and responsive to said output terminal reaching a selected voltage between said power supply voltage and said reference voltage, turning off the one of said pull-up and pull-down transistors turned on in the turning on step.

23. The method of claim 22, further comprising:

after the turning off step, monitoring the voltage at the output terminal; and responsive to said monitoring indicating that the voltage at the output terminal has changed by a selected amount, turning back on the one of said pull-up and pull-down transistors turned on in the turning on step, until the output terminal again reaches the selected voltage.

* * * * *